United States Patent
Lee et al.

(10) Patent No.: US 7,764,096 B2
(45) Date of Patent: Jul. 27, 2010

(54) DLL CIRCUIT AND METHOD OF CONTROLLING THE SAME

(75) Inventors: Hyun-Woo Lee, Ichon (KR); Won-Joo Yun, Ichon (KR)

(73) Assignee: Hynix Semiconductor Inc. (KR)

( * ) Notice: Subject to any disclaimer, the term of this patent is extended or adjusted under 35 U.S.C. 154(b) by 15 days.

(21) Appl. No.: 12/173,728

(22) Filed: Jul. 15, 2008

(65) Prior Publication Data

US 2009/0179675 A1 Jul. 16, 2009

(30) Foreign Application Priority Data

Jan. 14, 2008 (KR) .................... 10-2008-0004066

(51) Int. Cl.
*H03L 7/06* (2006.01)
(52) U.S. Cl. .................. 327/158; 327/156; 327/157; 327/172; 331/18; 331/19; 331/25; 331/34; 375/373; 375/376
(58) Field of Classification Search ......... 327/156–158, 327/172; 331/18–19, 25, 34; 375/373–376
See application file for complete search history.

(56) References Cited

U.S. PATENT DOCUMENTS

| | | | |
|---|---|---|---|
| 6,934,215 B2 * | 8/2005 | Chung et al. ......... | 365/233.12 |
| 6,963,235 B2 | 11/2005 | Lee | |
| 7,206,956 B2 | 4/2007 | Johnson et al. | |
| 7,250,798 B2 * | 7/2007 | Deivasigamani et al. .... | 327/149 |
| 7,282,976 B2 | 10/2007 | Park | |
| 7,332,948 B2 * | 2/2008 | Park et al. ................ | 327/175 |
| 7,372,311 B2 | 5/2008 | Kang | |

FOREIGN PATENT DOCUMENTS

| | | |
|---|---|---|
| JP | 2007-121114 | 5/2007 |
| KR | 1020040091975 | 11/2004 |
| KR | 1020040095981 | 11/2004 |
| KR | 1020040103035 | 12/2004 |
| KR | 1020080002590 | 1/2008 |

\* cited by examiner

*Primary Examiner*—Lincoln Donovan
*Assistant Examiner*—Shikha Goyal
(74) *Attorney, Agent, or Firm*—Baker & McKenzie LLP

(57) ABSTRACT

A delay locked loop (DLL) circuit includes a clock signal dividing unit that can divide a reference clock signal by a predetermined division ratio and generate a division clock signal, a feedback loop that can perform a delay locked operation on the division clock signal and generate a delay clock signal, a half period delay unit that can delay the delay clock signal by a half period of the reference clock signal and generate a half period delay clock signal, and an operation unit that can combine the delay clock signal and the half period delay clock signal and generate an output clock signal.

21 Claims, 4 Drawing Sheets

US 7,764,096 B2

DLL CIRCUIT AND METHOD OF CONTROLLING THE SAME

CROSS-REFERENCE TO RELATED PATENT APPLICATION

This application claims the benefit under 35 U.S.C 119(a) of Korean Application No. 10-2008-0004066, filed on Jan. 14, 2008, in the Korean Intellectual Property Office, the disclosure of which is incorporated herein in its entirety by reference as if set forth in full.

BACKGROUND

1. Technical Field

The embodiments described herein relate to a delay locked loop (DLL) circuit and a method for controlling the same, and more particularly, to a DLL circuit that can generate an internal clock signal whose phase is more advanced than a phase of an external clock signal and a method for controlling the same.

2. Related Art

In general, a DLL circuit is used to provide an internal clock signal whose phase is more advanced than a phase of a reference clock signal obtained by converting an external clock signal. The DLL circuit is also used to resolve the following problem: If an internal clock signal used in a semiconductor integrated circuit is delayed by a clock signal buffer and a transmission line, a phase difference is generated between the internal clock signal and an external clock signal, which results in an increased output data access time. As a result, in order to increase an effective data output period, the DLL circuit performs a control operation such that a phase of the internal clock signal is more advanced than a phase of the external clock signal by a predetermined amount.

The duty ratio of a DLL output clock signal should be maintained at a predetermined ratio (for example, 50:50) to prevent the deterioration of the operational efficiency of a DLL circuit. However, the duty ratio of the output clock signal from the DLL circuit can easily vary due to jitters outside the DLL circuit and irregular delay values of delay elements inside the DLL circuit. To prevent the duty ratio from varying, a conventional DLL circuit includes a duty cycle correction device to maintain a duty ratio of an output clock signal at a predetermined ratio.

However, a conventional duty cycle correction device included in a conventional DLL circuit occupies a wide area and has a long operation time, or an operational characteristic thereof is deteriorated when operating at low power. Due to the high-speed operation, high integration, and low power consumption of today's semiconductor integrated circuits, it has been required to implement a clock signal having an accurate duty ratio.

SUMMARY

A DLL circuit that is capable of generating a clock signal having an improved duty ratio characteristic and a method of controlling the same are described herein.

According to one aspect, a delay locked loop (DLL) circuit can include a clock signal dividing unit configured to divide a reference clock signal by a predetermined division ratio, thereby generating a division clock signal, a feedback loop configured to perform a delay locking operation on the division clock signal, thereby generating a delay clock signal, a half period delay unit configured to delay the delay clock signal by a half period of the reference clock signal, thereby generating a half period delay clock signal, and an operation unit configured to combine the delay clock signal and the half period delay clock signal, thereby generating an output clock signal.

According to another aspect, a delay locked loop (DLL) circuit can include a clock signal dividing unit configured to divide a reference clock signal by a predetermined division ratio, thereby generating a division clock signal, a first delay line configured to delay the division clock signal in response to a first delay control signal, thereby generating a first delay clock signal, a second delay line configured to delay the first delay clock signal in response to a second delay control signal, thereby generating a second delay clock signal and a third delay clock signal, a first delay controlling section configured to compare phases of the first delay clock signal and the third delay clock signal, thereby generating the second delay control signal, and an operation unit configured to combine the first delay clock signal and the second delay clock signal, thereby generating an output clock signal.

According to still another aspect, there is provided a method of controlling a delay locked loop (DLL) circuit. The method includes dividing a reference clock signal by a predetermined division ratio, thereby generating a division clock signal, performing a delay locking operation on the division clock signal, thereby generating a delay clock signal, delaying the delay clock signal by one period of the reference clock signal, and inverting the delay clock signal, thereby generating an inverted one period delay clock signal, delaying the delay clock signal by a half period of the reference clock signal according to a phase difference between the delay clock signal and the inverted one period delay clock signal, thereby generating a half period delay clock signal, and performing an XOR operation on the delay clock signal and the half period delay clock signal, thereby generating an output clock signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
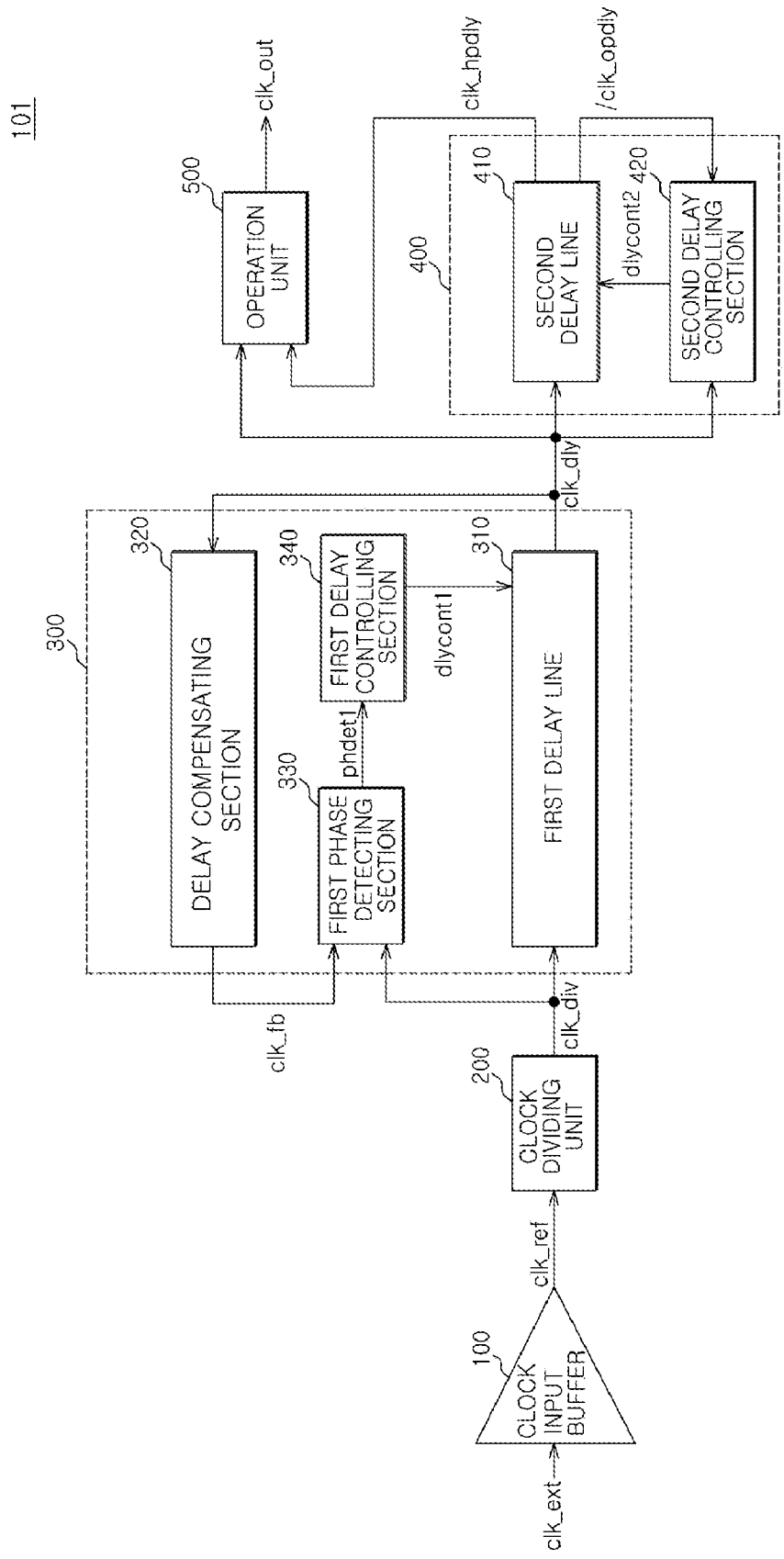
FIG. 1 is a block diagram illustrating a structure of a DLL circuit according to one embodiment.

FIG. 1 is a block diagram illustrating a structure of a DLL circuit 101 according to one embodiment. Referring to FIG. 1, the DLL circuit 101 can include a clock signal input buffer 100, a clock signal dividing unit 200, a first delay line 310, a delay compensating section 320, a first phase detecting section 330, a first delay controlling section 340, a second delay line 410, a second delay controlling section 420, and an operation unit 500.

The clock signal input buffer 100 can buffer an external clock signal "clk_ext" and generate a reference clock signal "clk_ref". The clock signal dividing unit 200 can divide a frequency of the reference clock signal "clk_ref" by a predetermined division ratio, e.g., a division ratio of 2, and generate a division clock signal "clk_div".

The first delay line 310 can delay the division clock signal "clk_div" in response to a first delay control signal "dlycont1" and generate a first delay clock signal (hereinafter, referred to as delay clock signal "clk_dly"). The delay compensating section 320 can apply a delay time, which can be obtained by simulating a delay amount via delay elements on an output path of the delay clock signal "clk_dly", to the delay clock signal "clk_dly" and generate a feedback clock signal "clk_fb". The first phase detecting section 330 can detect and compare phases of the reference clock signal "clk_ref" and the feedback clock signal "clk_fb" and generate a first phase detection signal "phdet1". The first delay controlling section 340 can generate the first delay control signal "dlycont1" in response to the first phase detection signal "phdet1".

The second delay line 410 can be configured to delay the delay clock signal "clk_dly" in response to a second delay control signal "dlycont2" and to generate a second delay clock signal (hereinafter, referred to as half period delay clock signal "clk_hpdly") and a third delay clock signal (hereinafter, inverted one period delay clock signal "/clk_opdly"). The second delay controlling section 420 can be configured to detect and compare phases of the delay clock signal "clk_dly" and the inverted one period delay clock signal "/clk_opdly" and to generate the second delay control signal "dlycont2".

The operation unit 500 can combine the delay clock signal "clk_dly" and the half period delay clock signal "clk hpdly" and generate an output clock signal "clk_out".

The clock signal dividing unit 200 can be implemented by a general flip-flop-typed clock signal divider and provide a duty cycle corrected clock signal because of a characteristic of a clock signal divider. That is, the division clock signal "clk_div" has a frequency that corresponds to half the frequency of the reference clock signal "clk_ref", and a waveform in which a duty cycle is corrected.

The inclusion of the clock signal dividing unit 200 decreases the operational cycles and peak current in a DLL circuit, which can result in reduced power consumption and improved power efficiency.

The first delay line 310, the delay compensating section 320, the first phase detecting section 330, and the first delay controlling section 340 can form a feedback loop 300. That is, the feedback loop 300 can perform a delay locked operation on the division clock signal "clk_div" and generate the delay clock signal "clk_dly".

The second delay line 410 and the second delay controlling section 420 can delay the delay clock signal "clk_dly" by a half period of the reference clock signal "clk_ref" and generate the half period delay clock signal "clk_hpdly". Therefore, the second delay line 410 and the second delay controlling section 420 can form a half period delay unit 400.

The operation unit 500 can generate the output clock signal "clk_out" with a corrected duty cycle by performing an XOR operation on the delay clock signal "clk_dly" and the half period delay clock signal "clk_hpdly" generated by delaying the delay clock signal "clk_dly" by the half period of the reference clock signal "clk_ref". It will be apparent that the operation unit 500 can comprise an exclusive NOR gate and an inverter. Therefore, a detailed description thereof will be omitted.

As described above, the DLL circuit can divide the frequency of the reference clock signal "clk_ref" by the predetermined division ratio to generate the division clock signal "clk_div" and perform the delay locked operation on the division clock signal "clk_div" to generate the delay clock signal "clk_dly". The DLL circuit can delay the delay clock signal "clk_dly" by the half period of the reference clock signal "clk_ref" and generate the half period delay clock signal "clk_hpdly". Then, the DLL circuit can perform an XOR operation on the delay clock signal "clk_dly" and the half period delay clock signal "clk_hpdly" and generate the output clock signal "clk_out" having a predetermined duty cycle.

Figure 2A:
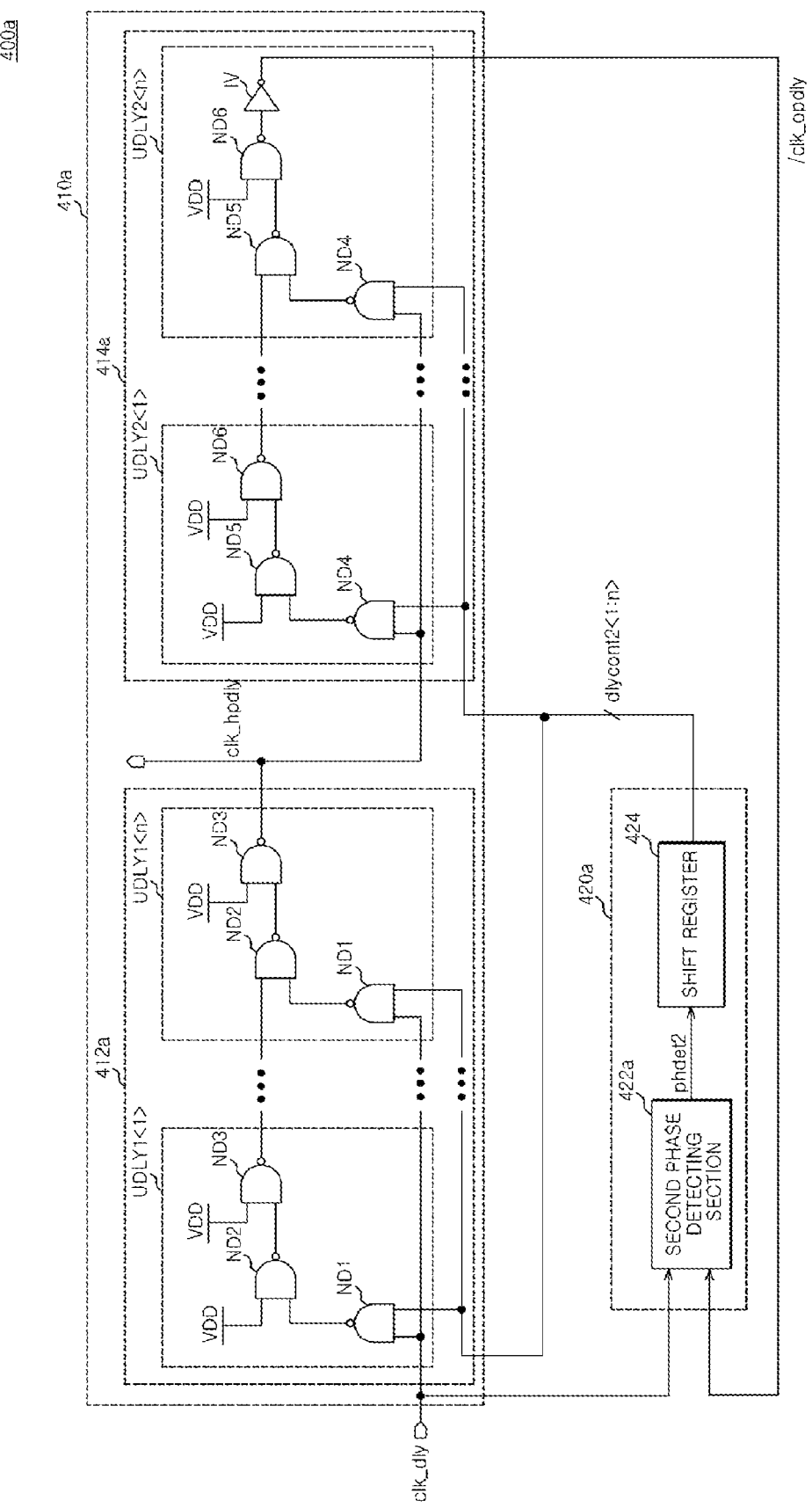
FIG. 2A is a diagram illustrating a detailed structure of a half period delay unit according to another embodiment and that can be included in the circuit illustrated in FIG. 1.

FIG. 2A is a diagram illustrating a detailed structure of a half period delay unit in accordance with one embodiment and that can be included in the circuit illustrated in FIG. 1. Referring to FIG. 2A, the half period delay unit 400a can include a second delay line 410a and a second delay controlling section 420a. FIG. 2A shows a digital circuit, according to one embodiment, in which the second delay controlling section 420a can output n bits of a digital code signal and control the delay amount of the second delay line 410a in a stepwise fashion.

The second delay line 410a can include a first delay section 412a and a second delay section 414a. The first delay section 412a can delay the delay clock signal "clk_dly" by the half period of the reference clock signal "clk_ref" in response to the second delay control signal "dlycont2<1:n>" and generate the half period delay clock signal "clk_hpdly". The second delay section 414a can delay the half period delay clock signal "clk_hpdly" by the half period of the reference clock signal "clk_ref" in response to the second delay control signal "dlycont2<1:n>", invert the half period delay clock signal, and generate the inverted one period delay clock signal "/clk_opdly".

The second delay controlling section 420a can include a second phase detecting section 422a and a shift register 424. The second phase detecting section 422a can detect phases of the delay clock signal "clk_dly" and the inverted one period delay clock signal "/clk_opdly" and generate a second phase detection signal "phdet2". The shift register 424 can control logical values of n bits of a signal in response to the second phase detection signal "phdet2" and output the signals as the second delay control signal "dlycont2<1:n>".

The second delay control signal "dlycont2<1:n>" can be implemented by combining n digital signals, wherein the n digital signals include one signal that has a logical value of '1'. The shift register 424 can shift the location of the signal having a logical value of '1' in response to the second phase detection signal "phdet2".

In order to perform this operation, the first delay section 412a and the second delay section 414a can include n NAND-gate-typed unit delays UDLY1<1:n> and UDLY2<1:n>, respectively.

Each of the unit delays UDLY1<1:n> that are included in the first delay section 412a can include first to third NAND gates ND1 to ND3. The first NAND gate ND1 can receive any one of the second delay control signal "dlycont2<1:n>" and the delay clock signal "clk_dly". The second NAND gate ND2 can receive an output signal from the first NAND gate ND1 and a signal transmitted from a unit delay at a previous stage. The third NAND gate ND3 can receive an output signal from the second NAND gate ND2 and an external voltage VDD.

In contrast, a second NAND gate ND2 of the unit delay UDLY1<1> at the first stage can be supplied with an external voltage VDD instead of an output signal from a unit delay at a previous stage. A third NAND gate ND3 of the unit delay UDLY1<n> at a last stage can output the half period delay clock signal "clk_hpdly".

Each of the unit delays UDLY2<1:n>, included in the second delay section 414a, can include fourth to sixth NAND gates ND4 to ND6.

The fourth NAND gate ND4 can receive the half period delay clock signal "clk_hpdly" and any one of the second delay control signal "dlycont2<1:n>". The fifth NAND gate ND5 can receive an output signal from the fourth NAND gate ND4 and a signal transmitted from a unit delay at a previous stage. The sixth NAND gate ND6 can receive an output signal from the fifth NAND gate ND5 and an external voltage VDD.

In contrast, a fifth NAND gate ND5 of the unit delay UDLY2<1> at the first stage can be supplied with the external voltage VDD instead of an output signal from a unit delay at a previous stage. The unit delay UDLY2<n> at a last stage can include an inverter IV that can receive an output signal from the sixth NAND gate ND6, and the inverter IV can output the inverted one period delay clock signal "/clk_opdly".

The first delay section 412a can accurately apply a delay time corresponding to the half period of the reference clock signal "clk_ref" to the delay clock signal "clk_dly". The second delay section 414a can accurately apply a delay time corresponding to the half period of the reference clock signal "clk_ref" to the half period delay clock signal "clk_hpdly". In this case, a phase of the inverted one period delay clock signal "/clk_opdly" can become the same as a phase of the delay clock signal "clk_dly". However, if the phase of the delay clock signal "clk_dly" is different from the phase of the inverted one period delay clock signal "/clk_opdly", then the second phase detecting section 422a can use the second phase detection signal "phdet2" to instruct the shift register 424 to increase or decrease a delay amount of the second delay line 410a.

Then, the shift register 424 can change the location of the signal having a logical value of '1' in the second delay control signal "dlycont2<1:n>" in response to the second phase detection signal "phdet2", and control the delay amount of the second delay line 410a. If this operation is performed, then the phase of the delay clock signal "clk_dly" can become the same as the phase of the inverted one period delay clock signal "/clk_opdly". As a result, the half period delay clock signal "clk_hpdly" can be generated by delaying the delay clock signal "clk_dly" by the half period of the reference clock signal "clk_ref".

Figure 2B:
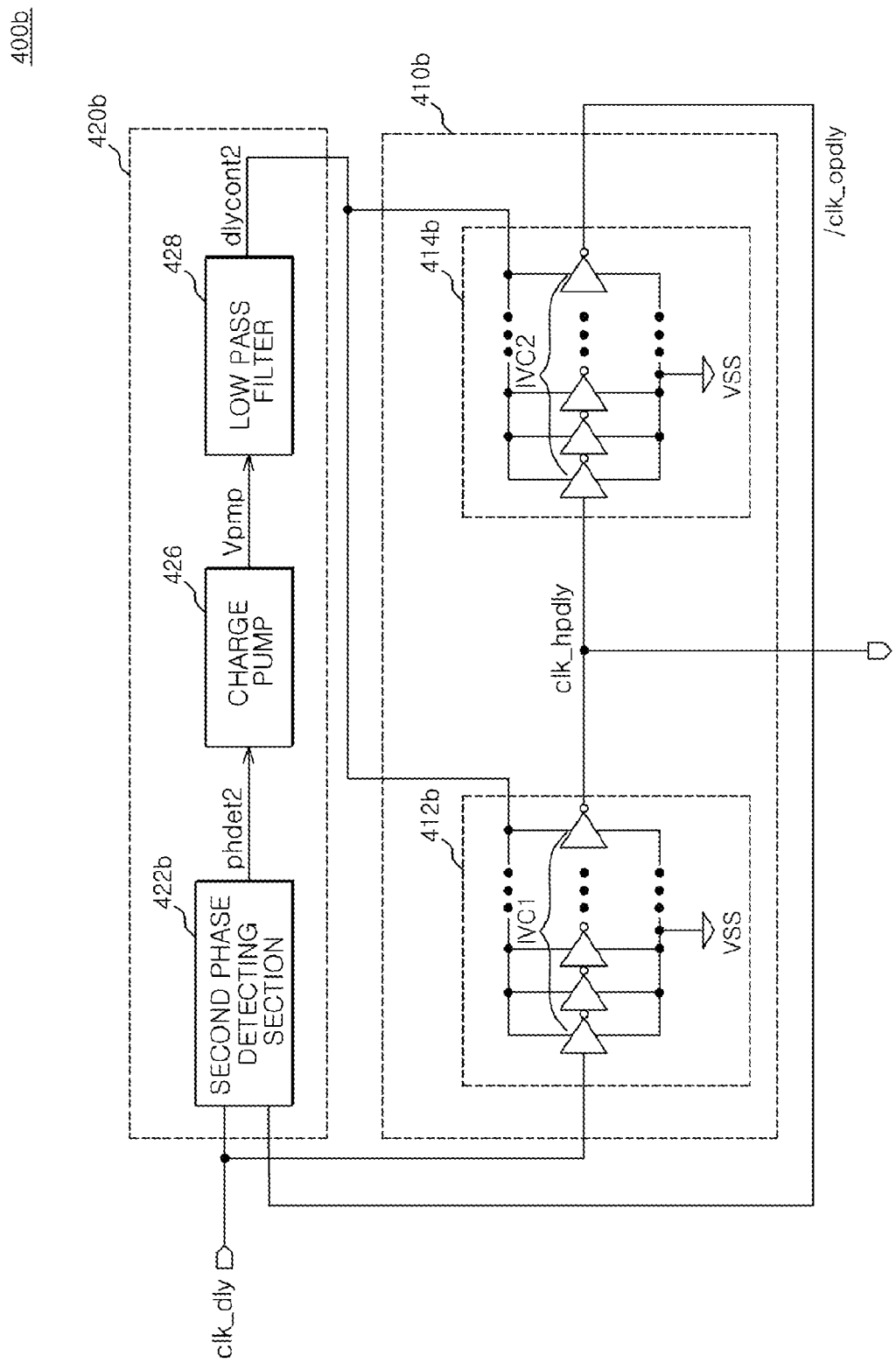
FIG. 2B is diagram illustrating a detailed structure of a half period delay unit according to another embodiment and that can be included in the circuit illustrated in FIG. 1.

FIG. 2B is a diagram illustrating a half period delay unit according to another embodiment and that can be included in the circuit illustrated in FIG. 1. Referring to FIG. 2B, the half period delay unit 400b can include a second delay line 410b and a second delay controlling section 420b. FIG. 2B shows an analog circuit in which the second delay controlling section 420b can output a level signal and control the delay amount of the second delay line 410b according to the level of the signal.

The second delay line 410b can include a first delay section 412b and a second delay section 414b. The first delay section 412b can delay the delay clock signal "clk_dly" by the half period of the reference clock signal "clk_ref", in response to the second delay control signal "dlycont2", and generate the half period delay clock signal "clk_hpdly". The second delay section 414b can delay the half period delay clock signal "clk_hpdly" by the half period of the reference clock signal "clk_ref" in response to the second delay control signal "dlycont2", invert the half period delay clock signal, and generate the inverted one period delay clock signal "/clk_opdly".

The second delay controlling section 420b can include a second phase detecting section 422b, a charge pump 426, and a low pass filter 428.

The second phase detecting section 422b can detect phases of the delay clock signal "clk_dly" and the inverted one period delay clock signal "/clk_opdly" and generate a second phase detection signal "phdet2". The charge pump 426 can perform a voltage pumping operation in response to the second phase detection signal "phdet2" and generate a pumping voltage Vpmp. The low pass filter 428 can remove a noise component of the pumping voltage Vpmp and generate the second delay control signal "dlycont2".

The second delay control signal "dlycont2" can be used to control the delay amount of the second delay line 410b according to a voltage level. That is, the second delay control signal "dlycont2" can be a signal in which a voltage level is important. The second phase detecting section 422b, the charge pump 426, and the low pass filter 428 may be easily implemented in the same type as the components included in a general phase locked loop (PLL) circuit.

Each of the first delay section 412b and the second delay section 414b can be implemented using a voltage controlled delay line (VCDL) in which a delay amount varies according to a level of a supplied voltage. In one such embodiment, each of the first delay section 412b and the second delay section 414b can be implemented in a form of a VCDL using an inverter chain.

The first delay section 412b can include a first inverter chain IVC1 that has a voltage supply terminal configured to receive the second delay control signal "dlycont2" and delay the delay clock signal "clk_dly". The first inverter chain IVC1 can include an even-numbered amount of inverters connected in series.

The second delay section 414b can include a second inverter chain IVC2 that can have a voltage supply terminal configured to receive the second delay control signal "dlycont2" and delay the half period delay clock signal "clk_hpdly". The second inverter chain IVC2 can include an odd-numbered amount of inverters connected in series.

If the phase of the delay clock signal "clk_dly" is different from the phase of the inverted one period delay clock signal "/clk_opdly", the second phase detecting section 422b can use the second phase detection signal "phdet2" to instruct the charge pump 426 to increase or decrease the delay amount of the second delay line 410b. Then, the charge pump 426 can generate the pumping voltage Vpmp that has a voltage level corresponding to the second phase detection signal "phdet2". The low pass filter 428 can filter a noise component of the pumping voltage Vpmp and output the second delay control signal "dlycont2". If this operation is performed, the phase of the delay clock signal "clk_dly" may become the same as the phase of the inverted one period delay clock signal "/clk_opdly". The half period delay clock signal "clk_hpdly" may be generated by delaying the delay clock signal "clk_dly" by the half period of the reference clock signal "clk_ref".

Figure 3:
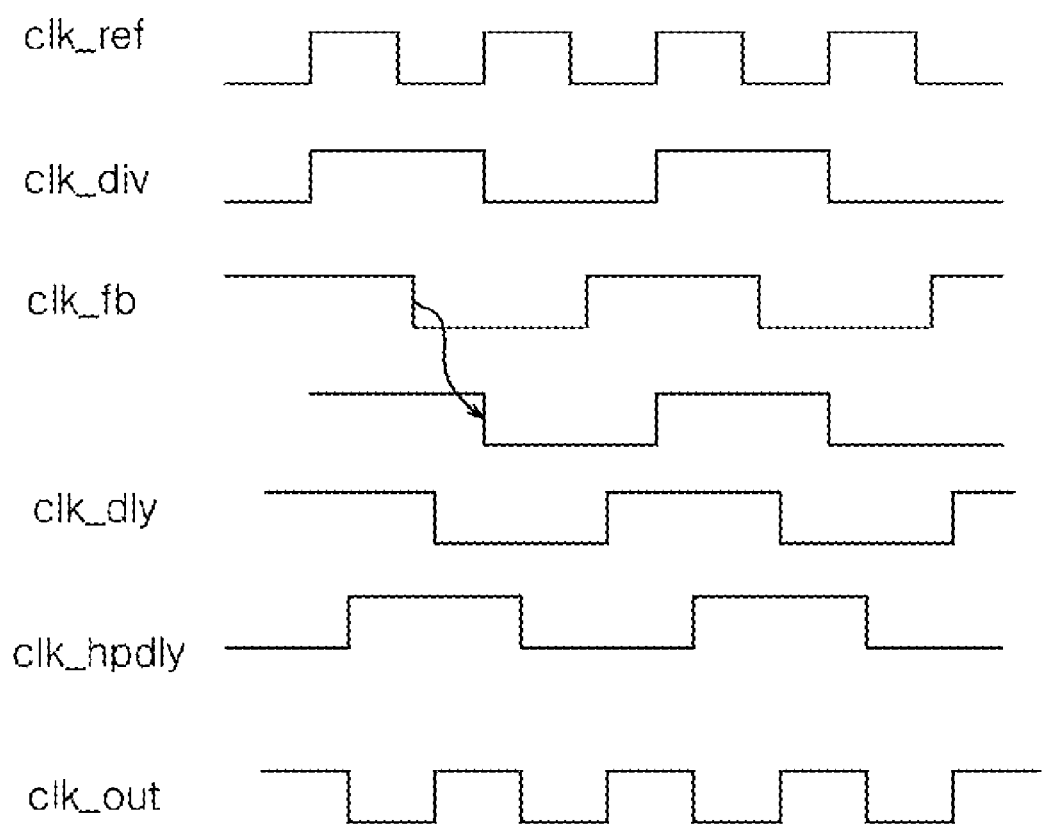
FIG. 3 is a timing chart illustrating the operation of a DLL circuit of FIG. 1 in accordance with one embodiment.

FIG. 3 is a timing chart illustrating the operation of the DLL circuit of FIG. 1. Referring to FIG. 3 and as has been explained, the division clock signal "clk_div" can have a frequency that corresponds to half the frequency of the reference clock signal "clk_ref". As shown in FIG. 3, the DLL circuit 101 can make the phase of the feedback clock signal "clk_fb" the same as the phase of the division clock signal "clk_div" and then complete a delay locked operation. At this time, the phase of the delay clock signal "clk_dly" can lead the phase of the feedback clock signal "clk_fb" by the delay amount of the delay compensating section 320.

The half period delay unit 400 can delay the delay clock signal "clk_dly" by the half period of the reference clock signal "clk_ref" and generate the half period delay clock signal "clk_hpdly". The output clock signal "clk_out" can be generated by the operation unit 500 in the following manner: If the levels of the delay clock signal "clk_dly" and the half period delay clock signal "clk_hpdly" are the same, then the operation unit 500 can generate the output clock signal "clk_out" as a low-level signal.

In contrast, if the levels of the delay clock signal "clk_dly" and the half period delay clock signal "clk_hpdly" are different from each other, then the operation unit 500 can generate the output clock signal "clk_out" as high-level signal.

As described above, the DLL circuit can divide the frequency of the reference clock signal by the predetermined division ratio, and input the division clock signal to the feedback loop to perform a delay locked operation on the division clock signal. If the delay locked operation of the feedback loop is completed, the DLL circuit can delay an output clock signal from the feedback loop by the half period of the reference clock signal and perform an XOR operation on the output clock signal from the feedback loop and a clock signal generated by delaying the output clock signal from the feedback loop by the half period of the reference clock signal, thereby generating the output clock signal having a predetermined duty cycle.

As such, the DLL circuit can generate a clock signal that has an improved duty cycle, thereby stably supporting the operation of a semiconductor integrated circuit. Further, the DLL circuit can divide the frequency of the reference clock signal by the predetermined division ratio and perform a delay locked operation and a duty cycle correction operation. Therefore, it is possible to decrease the operational current of DLL circuit and improve power efficiency.

while certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay locked loop (DLL) circuit comprising:
   a clock signal dividing unit configured to divide a reference clock signal by a predetermined division ratio, thereby generating a division clock signal;
   a feedback loop configured to perform a delay locking operation on the division clock signal, thereby generating a delay clock signal;
   a half period delay unit configured to delay the delay clock signal by a half period of the reference clock signal, thereby generating a half period delay clock signal; and
   an operation unit configured to combine the delay clock signal and the half period delay clock signal, thereby generating an output clock signal.

2. The DLL circuit of claim 1, wherein the feedback loop comprises:
   a delay line configured to delay the division clock signal in response to a delay control signal, thereby generating the delay clock signal;
   a delay compensating section configured to apply a predetermined delay amount to the delay clock signal, thereby generating a feedback clock signal;
   a phase detecting unit configured to detect and compare phases of the reference clock signal and the feedback clock signal, thereby generating a phase detection signal; and
   a delay controlling section configured to generate the delay control signal in response to the phase detection signal.

3. The DLL circuit of claim 1, wherein the half period delay unit comprises:
   a delay line configured to delay the delay clock signal in response to a delay control signal, thereby generating the half period delay clock signal and an inverted one period delay clock signal; and
   a delay controlling section configured to detect and compare phases of the delay clock signal and the inverted one period delay clock signal, thereby generating the delay control signal.

4. The DLL circuit of claim 3, wherein the delay line comprises:
   a first delay section configured to delay the delay clock signal in response to the delay control signal, thereby generating the half period delay clock signal having a phase difference corresponding to a half period of the reference clock signal with respect to the delay clock signal; and
   a second delay section configured to delay the half period delay clock signal in response to the delay control signal, thereby generating a clock signal having a phase difference corresponding to the half period of the reference clock signal with respect to the half period delay clock signal, and to invert the generated clock signal, thereby generating the inverted one period delay clock signal.

5. The DLL circuit of claim 4, wherein the delay control signal includes a plurality of digital signals, and the first delay section includes a plurality of unit delayers each of which is configured to receive one of the plurality of digital signals and the delay clock signal.

6. The DLL circuit of claim 5, wherein the second delay section includes a plurality of unit delayers each of which is configured to receive one of the plurality of digital signals and the half period delay clock signal, and an inverter configured to output the inverted one period delay clock signal provided at a final output terminal of the plurality of unit delayers.

7. The DLL circuit of claim 6, wherein the delay controlling section comprises:
   a phase detecting section configured to detect phases of the delay clock signal and the inverted one period delay clock signal, thereby generating a phase detection signal; and
   a shift register configured to control logical values of a plurality of bits of digital signals in response to the phase detection signal, thereby outputting the delay control signal.

8. The DLL circuit of claim 4, wherein the delay control signal is a level signal that controls a delay amount of the delay line according to a voltage level, and the first delay section is configured to include a voltage controlled delay line (VCDL) to determine a delay amount according to a voltage level of the delay control signal, receive the delay clock signal, and output the half period delay clock signal.

9. The DLL circuit of claim 8, wherein the second delay section includes a voltage controlled delay line configured to determine a delay amount according to the voltage level of the delay control signal, receive the half period delay clock signal, and output the inverted one period delay clock signal.

10. The DLL circuit of claim 9, wherein the delay controlling section comprises:
    a phase detecting section configured to detect phases of the delay clock signal and the inverted one period delay clock signal, thereby generating a phase detection signal;
    a charge pump configured to perform a voltage pumping operation in response to the phase detection signal, thereby generating a pumping voltage; and a low pass filter configured to remove a noise of the pumping voltage, thereby generating the delay control signal.

11. The DLL circuit of claim 1, wherein the operation unit is configured to perform an XOR operation on the delay clock signal and the half period delay clock signal, thereby generating the output clock signal.

12. A delay locked loop (DLL) circuit comprising:
a clock signal dividing unit configured to divide a reference clock signal by a predetermined division ratio, thereby generating a division clock signal;
a first delay line configured to delay the division clock signal in response to a first delay control signal, thereby generating a first delay clock signal;
a second delay line configured to delay the first delay clock signal in response to a second delay control signal, thereby generating a second delay clock signal and a third delay clock signal;
a first delay controlling section configured to compare phases of the first delay clock signal and the third delay clock signal, thereby generating the second delay control signal; and
an operation unit configured to combine the first delay clock signal and the second delay clock signal, thereby generating an output clock signal.

13. The DLL circuit of claim 12, wherein the second delay line comprises:
a first delay section configured to delay the first delay clock signal in response to the second delay control signal, thereby generating the second delay clock signal having a phase difference corresponding to a half period of the reference clock signal with respect to the first delay clock signal; and
a second delay section configured to delay the second delay clock signal in response to the second delay control signal, thereby generating a clock signal having a phase difference corresponding to a half period of the reference clock signal with respect to the second delay clock signal, and to invert the generated clock signal, thereby generating the third delay clock signal.

14. The DLL circuit of claim 12, wherein the first delay controlling section comprises:
a phase detecting section configured to detect phases of the first delay clock signal and the third delay clock signal, thereby generating a phase detection signal; and
a shift register configured to control logical values of a plurality of bits of digital signals in response to the phase detection signal, thereby outputting the second delay control signal.

15. The DLL circuit of claim 12, wherein the first delay controlling section comprises:
a phase detecting section configured to detect phases of the first delay clock signal and the third delay clock signal, thereby generating a phase detection signal;
a charge pump configured to perform a voltage pumping operation in response to the phase detection signal, thereby generating a pumping voltage; and
a low pass filter configured to remove a noise of the pumping voltage, thereby generating the second delay control signal.

16. The DLL circuit of claim 12, wherein the operation unit is configured to perform an XOR operation on the delay clock signal and the half period delay clock signal, thereby generating the output clock signal.

17. The DLL circuit of claim 12, further comprising:
a delay compensating section configured to apply a predetermined delay amount to the first delay clock signal, thereby generating a feedback clock signal;
a phase detecting unit configured to detect and compare phases of the reference clock signal and the feedback clock signal, thereby generating a phase detection signal; and
a second delay controlling section configured to generate the first delay control signal in response to the phase detection signal.

18. A method of controlling a delay locked loop (DLL) circuit, comprising:
dividing a reference clock signal by a predetermined division ratio, thereby generating a division clock signal;
performing a delay locking operation on the division clock signal, thereby generating a delay clock signal;
delaying the delay clock signal by one period of the reference clock signal, and inverting the delay clock signal, thereby generating an inverted one period delay clock signal;
delaying the delay clock signal by a half period of the reference clock signal according to a phase difference between the delay clock signal and the inverted one period delay clock signal, thereby generating a half period delay clock signal; and
performing an XOR operation on the delay clock signal and the half period delay clock signal, thereby generating an output clock signal.

19. The method of claim 18, wherein the generating of the half period delay clock signal comprises:
detecting phases of the delay clock signal and the inverted one period delay clock signal, thereby generating a phase detection signal; and
controlling logical values of a plurality of bits of digital signals in response to the phase detection signal, thereby outputting a delay control signal.

20. The method of claim 18, wherein the generating of the half period delay clock signal comprises:
detecting phases of the delay clock signal and the inverted one period delay clock signal, thereby generating a phase detection signal;
performing a voltage pumping operation in response to the phase detection signal, thereby generating a pumping voltage; and
removing a noise of the pumping voltage, thereby generating a delay control signal.

21. The method of claim 18, wherein the generating of the delay clock signal comprises:
applying to the delay clock signal a delay time obtained by simulating a delay amount of delay elements on an output path of the delay clock signal, thereby generating a feedback clock signal;
detecting and comparing phases of the reference clock signal and the feedback clock signal, thereby generating a phase detection signal;
generating a delay control signal in response to the phase detection signal; and
delaying the division clock signal in response to the delay control signal, thereby generating the delay clock signal.

* * * * *